US010347741B1

(12) United States Patent
Liang et al.

(10) Patent No.: US 10,347,741 B1
(45) Date of Patent: Jul. 9, 2019

(54) GAPFILL IMPROVEMENT

(71) Applicant: Taiwan Semiconductor Manufacturing Co., Ltd., Hsinchu (TW)

(72) Inventors: Pin-Ju Liang, Hsinchu (TW); De-Wei Yu, Ping-tung (TW); Yi-Cheng Li, Hsinchu (TW); Chien-Hao Chen, Chuangwei Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/991,270

(22) Filed: May 29, 2018

(51) Int. Cl.
  *H01L 29/78* (2006.01)
  *H01L 27/088* (2006.01)
  *H01L 21/8234* (2006.01)
  *H01L 21/31* (2006.01)
  *H01L 21/3105* (2006.01)
  *H01L 29/49* (2006.01)
  *H01L 29/66* (2006.01)
  *H01L 21/02* (2006.01)

(52) U.S. Cl.
  CPC .... *H01L 29/66545* (2013.01); *H01L 21/0228* (2013.01); *H01L 21/02356* (2013.01); *H01L 21/02362* (2013.01); *H01L 21/823431* (2013.01); *H01L 27/0886* (2013.01); *H01L 29/66795* (2013.01); *H01L 29/785* (2013.01)

(58) Field of Classification Search
  CPC .......... H01L 21/0228; H01L 21/02356; H01L 21/823431; H01L 21/845; H01L 29/66545; H01L 29/66795–66803; H01L 29/785–7856; H01L 2029/7858; H01L 27/0886; H01L 27/1211
  See application file for complete search history.

(56) References Cited

U.S. PATENT DOCUMENTS

| 2004/0114900 | A1* | 6/2004 | Pan | .............. C23C 16/401 385/129 |
| 2009/0068854 | A1* | 3/2009 | Chen | ............ H01L 21/3185 438/792 |
| 2017/0271196 | A1* | 9/2017 | Manna | ........... H01L 21/76224 |
| 2018/0096898 | A1* | 4/2018 | Yu | ............... H01L 21/823431 |
| 2019/0043763 | A1* | 2/2019 | Li | ................ H01L 21/823857 |

* cited by examiner

*Primary Examiner* — Zandra V Smith
*Assistant Examiner* — Molly K Reida
(74) *Attorney, Agent, or Firm* — Slater Matsil, LLP

(57) ABSTRACT

Embodiments disclosed herein relate generally to forming a gate layer in high aspect ratio trenches using a cyclic deposition-etch process. In an embodiment, a method for semiconductor processing is provided. The method includes performing a cyclic deposition-etch process to form a conformal film over a bottom surface and along sidewall surfaces of a feature on a substrate. The method includes reflowing the conformal film. The method includes forming a cap layer on the reflowed film. The method includes depositing a crystalline film on the cap layer. The method includes crystallizing the reflowed film and the cap layer after depositing the crystalline film.

20 Claims, 15 Drawing Sheets

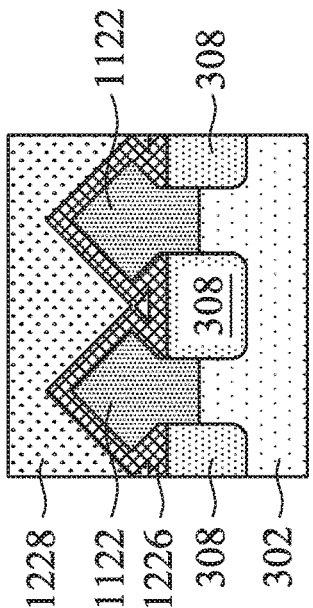
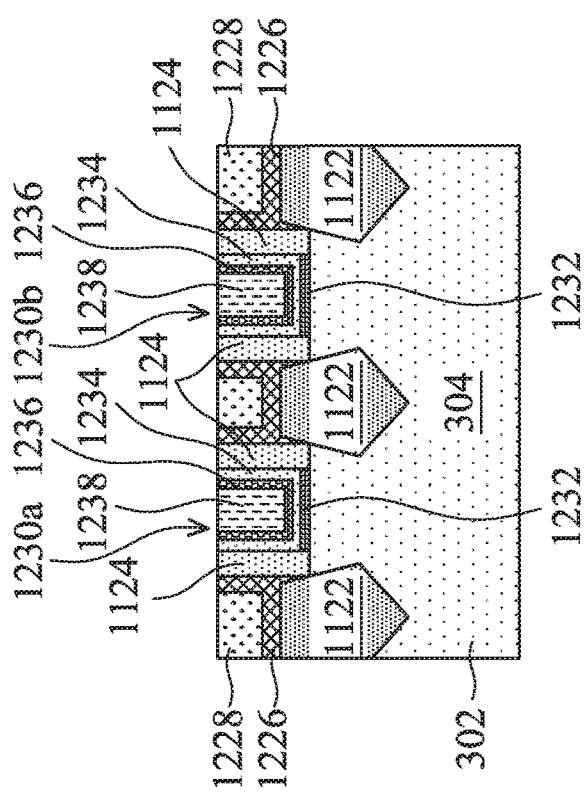
FIG. 12B
FIG. 12A

US 10,347,741 B1

GAPFILL IMPROVEMENT

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. With the decreasing in scaling, however, it has been challenging to deposit a film in high aspect ratio trenches with small dimension without being presented problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 8, 9A-9B, 10A-10C, 11A-11B, 12A-12B, and 13A-13B illustrate various schematic three-dimensional and cross-sectional views of intermediate structures corresponding to various stages of fabrication according to some embodiments.

DETAILED DESCRIPTION

Figure 1:
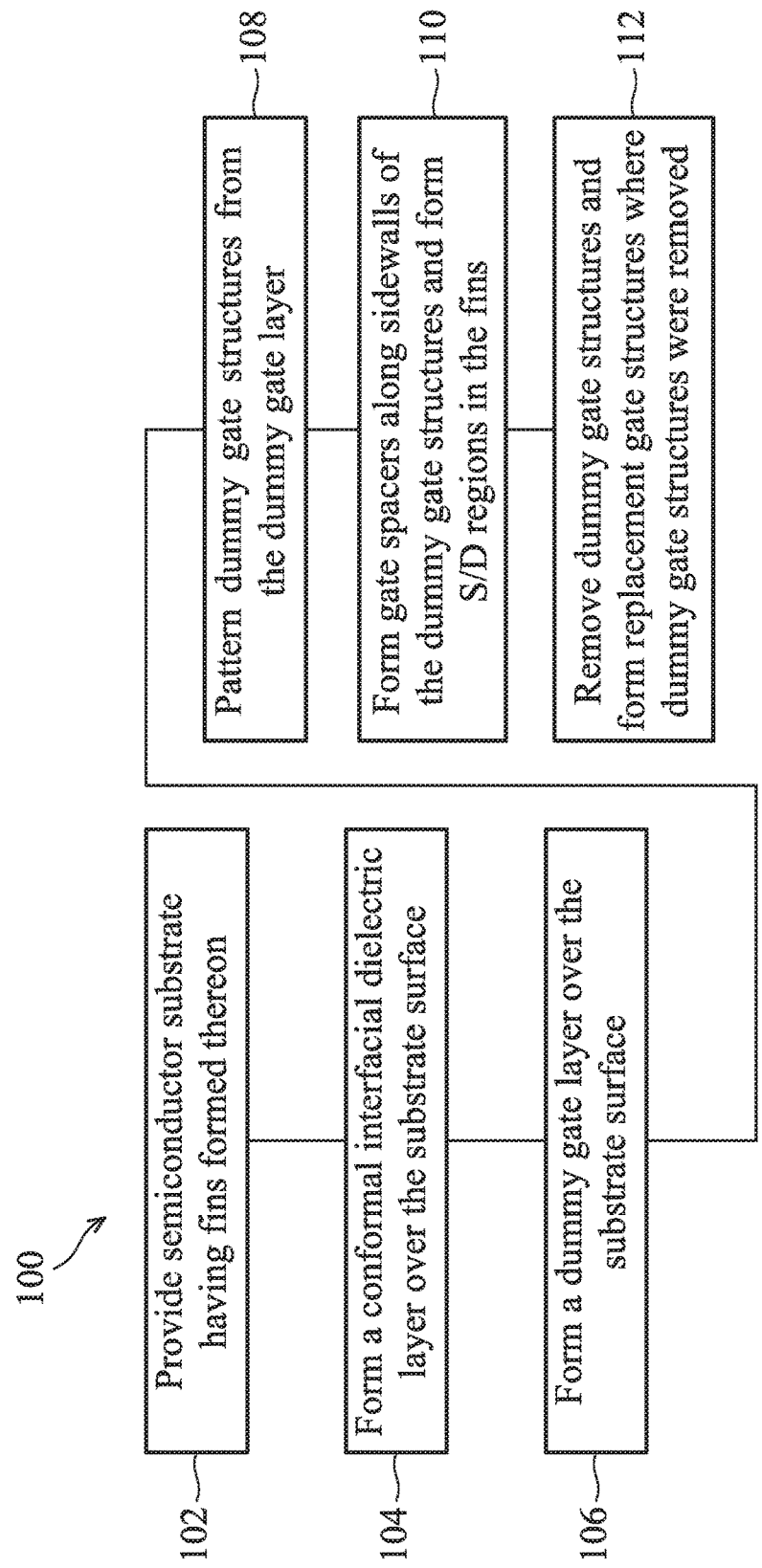
FIG. 1 is a flow chart illustrating an example method for fabricating a semiconductor device structure according to some embodiments.

The following disclosure provides many different embodiments, for examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to depositing a film or layer in semiconductor processing. Embodiments specifically described herein are in the context of depositing a film or layer in trenches between fins, which trenches can have a high aspect ratio. A cyclic deposition-etching process can include depositing a portion of the film or layer, etching a portion of the film, and repeating the depositing and etching any number of times. After any number of cycles of the cyclic deposition-etching process, but before the film or layer merges by lateral growth from sidewalls in the respective trenches, an anneal process can be performed on the deposited layer to cause the material of the film or layer to reflow. After the anneal process, another portion of the film or layer is deposited. Depositing the portion of the film or layer after the anneal process may result in formation of seams and/or voids in the film or layer. After depositing the portion of the film or layer after the anneal process, a crystalline film or layer (e.g., polycrystalline) can be deposited, and another anneal process can be performed. The reflow process, the deposition of the crystalline film or layer, and the anneal process can reduce or eliminate voids or seams in the film or layer in the trench as well as reducing or elimination bending of the fins. Aspects of examples described herein can be applied to depositing a film or layer in any trench or recess, which may have a high aspect ratio.

Figure 2:
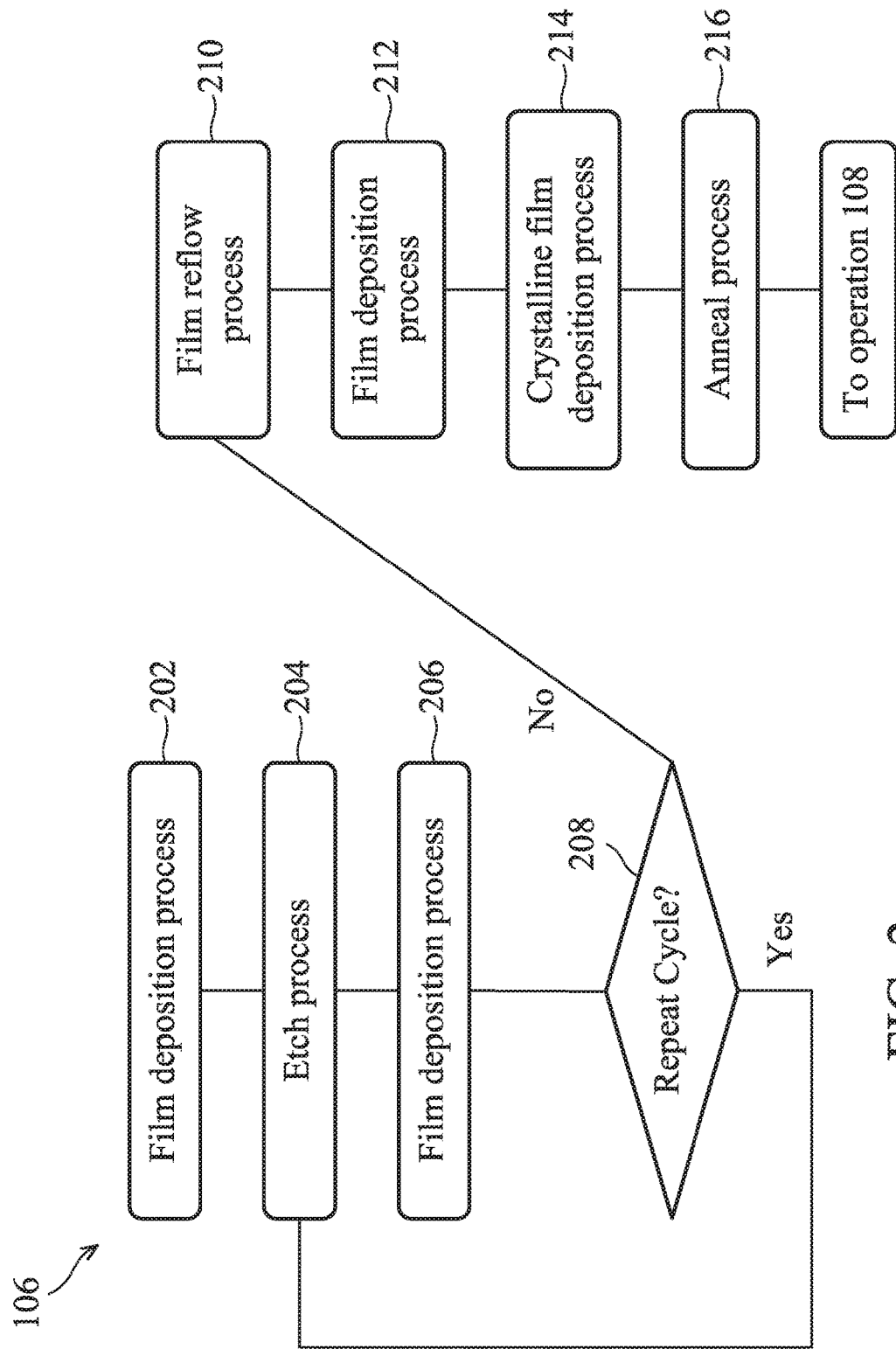
FIG. 2 illustrates an example dummy gate layer formation process according to some embodiments.

FIG. 1 is a flow chart 100 illustrating an exemplary method for fabricating a semiconductor device structure according to some embodiments. FIG. 2 illustrates an example dummy gate layer formation process 106 that can be used during operation of the flow chart 100 of FIG. 1 according to some embodiments. FIGS. 3 through 13B are schematic three-dimensional and cross-sectional views of intermediate structures corresponding to various stages of fabrication according to the flow chart of FIG. 1 in accordance with some embodiments. It is noted that the flow chart 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

Figure 3:
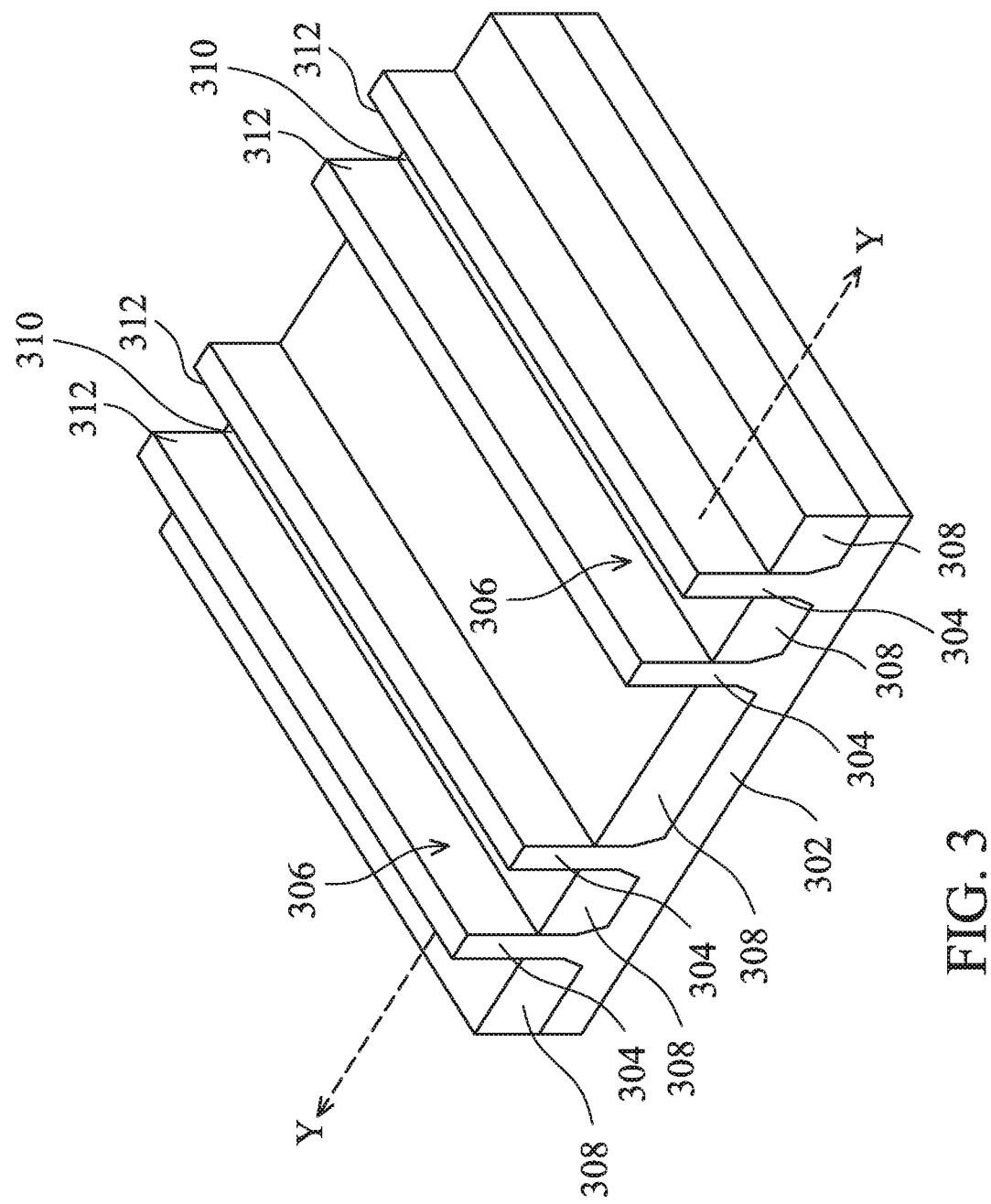

The flow chart 100 begins at operation 102, and further with reference to FIG. 3, by providing a semiconductor substrate 302 having fins 304 formed thereon. The semiconductor substrate 302 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 302 may include an elemental semiconductor including silicon (Si) or germanium (Ge); a compound semiconductor; an alloy semiconductor; or a combination thereof. Each fin 304 provides an active area where one or more devices are to be formed. The fins 304 are fabricated using suitable processes performed on the semiconductor substrate 302 to form trenches 306 in the substrate 302, leaving the fins 304 extended upwardly from the substrate 302. The fins 304 may be patterned by any suitable method. For example, the fins 304 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over the semiconductor substrate 302 and patterned using a photolithography process. Spacers are formed alongside the patterned sacrificial layer using a self-aligned process. The sacrificial layer is then removed, and the remaining spacers may then be used to pattern the fins 304.

The trenches 306 may then be filled with an insulating material. The insulating material may be any suitable dielectric such as an oxide (e.g., silicon oxide), a nitride, the like, or a combination thereof. The insulating material is then recessed, such as by using an acceptable etch process, to form isolation regions 308. The insulating material is recessed such that the top portion of the fins 304 is exposed. The fins 304 protrude above and from between neighboring isolation regions 308.

FIG. 3 further illustrates a cross-section Y-Y. FIGS. 4 through 9A illustrate cross-sections of intermediate structures corresponding to the cross-section Y-Y at various stages of fabrication.

Figure 4:
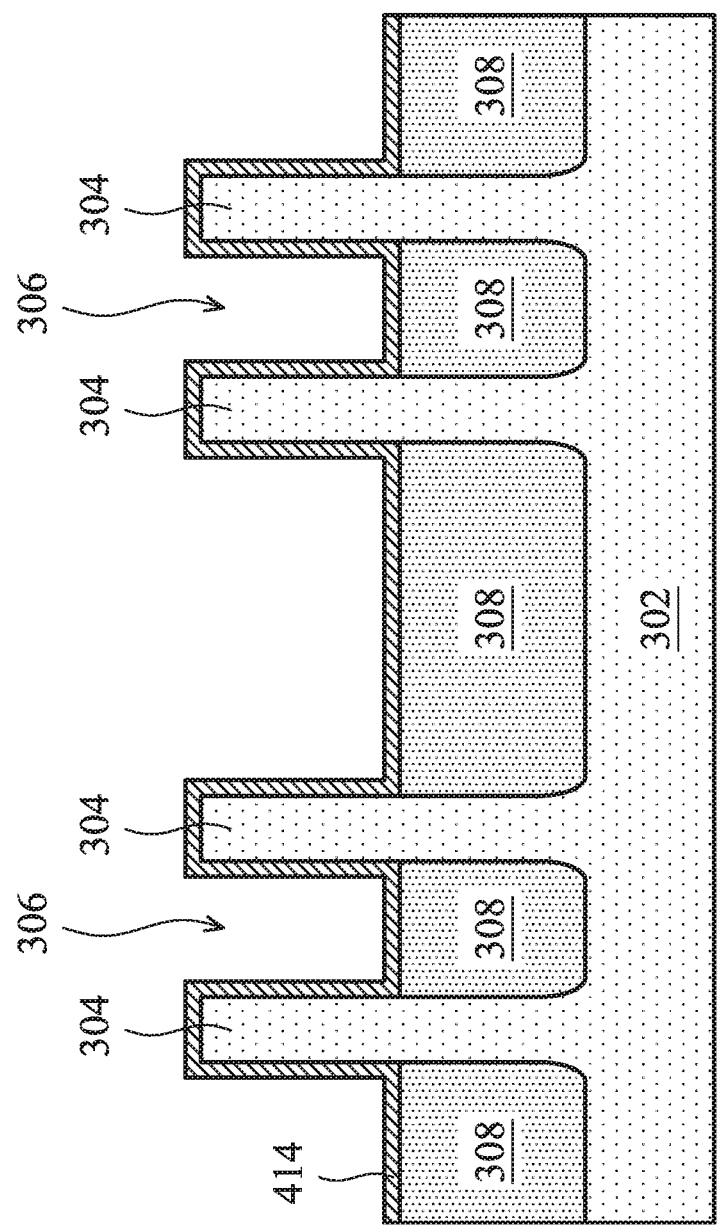

At operation 104, and further with reference to FIG. 4, an interfacial dielectric layer 414 is conformally formed over the substrate 302 to cover the fins 304 and the exposed surfaces of the isolation regions 308. The interfacial dielectric layer 414 may include or be silicon oxide, silicon nitride, the like, or multilayers thereof, and may be thermally and/or chemically grown on the fins 304, or conformally deposited, such as by plasma enhanced chemical vapor deposition (PECVD), atomic layer deposition (ALD), or any suitable deposition technique. In some embodiments, and further at operation 104, a seed layer (not shown) may be conformally formed on the interfacial dielectric layer 414. The seed layer can be formed on the interfacial dielectric layer 414 to help uniform growth of the subsequent dummy gate layer on the fins 304 and the isolation regions 308. The seed layer may be chosen depending on the material of the subsequent dummy gate layer. In some embodiments where the subsequent dummy gate layer includes silicon (e.g., polysilicon or amorphous silicon), the seed layer may be a silicon-containing film. In such a case, the seed layer can be formed by exposing the substrate surface to a silicon-containing compound to form a solid thin film layer containing silicon on the interfacial dielectric layer 414. The term "substrate surface" in this disclosure is intended to include the exposed surface of a film/layer or partial film/layer that has been deposited onto a substrate, such as the substrate 302, and the exposed surface of the newly deposited film/layer can also become the substrate surface prior to any subsequent process(es). The seed layer may be formed by ALD, chemical vapor deposition (CVD), or any suitable deposition technique. In some embodiments, the seed layer is a silicon layer formed by ALD. Suitable silicon-containing compounds may include, but are not limited to, $(SiH_3)3N$, $Si[N(CH_3)_2]_4$, $SiH[N(CH_3)_2]_3$, $SiH_2[N(CH_3)_2]_2$, $SiH_3[N(CH_3)_2]$, $SiH_3[N((CH-CH_3)_2)_2]$, the like, or combinations thereof. In some embodiments, the seed layer is formed using $SiH_3[N((CH-CH_3)_2)_2]$.

At operation 106, a dummy gate layer is formed over the substrate surface (e.g., over the interfacial dielectric layer 414 and/or the seed layer if used) and fills the trenches 306.

Each of the trenches 306 has a bottom surface 310 (e.g., top surface of the isolation region 308) and sidewall surfaces 312 extending upwardly from the bottom surface 310. In various embodiments, the trenches 306 may have an aspect ratio of about 3:1 to about 30:1, such as about 5:1 to about 20:1, for example about 8:1 to about 10:1. The term "aspect ratio" refers to the ratio of the height dimension to the width dimension of a particular feature, for example, trench height/trench width. The trench height substantially equals to the height of the fins 304 protruding above the isolation regions 308 while the trench width substantially equals to the width or distance of the isolation region 308 between two neighboring fins 304.

A dummy gate layer formation process described herein may deposit a film in high aspect ratio trenches without (e.g., by eliminating) a seam or void. Particularly, the dummy gate formation process can be used to fill features with any suitable aspect ratio (ratio of the depth of the feature to the width of the feature), such as a feature with an aspect ratio equal or greater than 5:1, 10:1, 20:1, 25:1, 30:1, 35:1, 40:1, 50:1, or 100:1. As described in more detail herein, various embodiments of the dummy gate layer formation process include a cyclic process for depositing and etching a film in high aspect ratio trenches defined between neighboring fins 304 and annealing the film in order to cause the film to reflow, for example, by breaking Si—H bonds in the film and creating dangling bonds. The Si—Si bonds and/or Si—H bonds reform from the dangling bonds, which can densify the film and can reduce or eliminate bending of the fins. After the anneal, another deposition process can be performed to form a cap layer over the deposited film to fill the trenches and cover the fins. Crystalline silicon (e.g., polycrystalline silicon, or polysilicon) can be deposited over the cap layer and another anneal process can be performed. The crystalline silicon deposition and anneal processes crystallizes the film and removes seams and/or voids in the film.

FIG. 2 illustrates an example dummy gate layer formation process 106 that can be used during the operation 106 according to some embodiments, and FIGS. 5 to 9A-9B are schematic cross-sectional views of intermediate structures corresponding to various stages of trench filling according to the flow chart of FIG. 2. The dummy gate layer formation process 106 generally includes a film deposition process 202, an etching process 204, a film deposition process 206, a film reflow process 210, another film deposition process 212, a crystalline film deposition process 214, and an anneal process 216. A purge process, such as by flowing a purge gas such as an inert gas, may be performed between the various deposition, etch, film reflow, and anneal processes 202-216 when the processes 202-216 are performed in a same processing chamber, for example. For example, the dummy gate layer formation process 106 may include cycles of the film deposition process 202, followed by a chamber purge, followed by the etching process 204, followed by a chamber purge, followed by the film deposition process 206, and followed by a chamber purge. The inert gas may be any suitable inert gas such as argon, helium, neon, or any combination thereof. The film deposition processes 202, 206, 212, 214, the etching process 204, the film reflow process 210, and/or the anneal process 216 may be performed in the same or different processing chamber.

Figure 5:
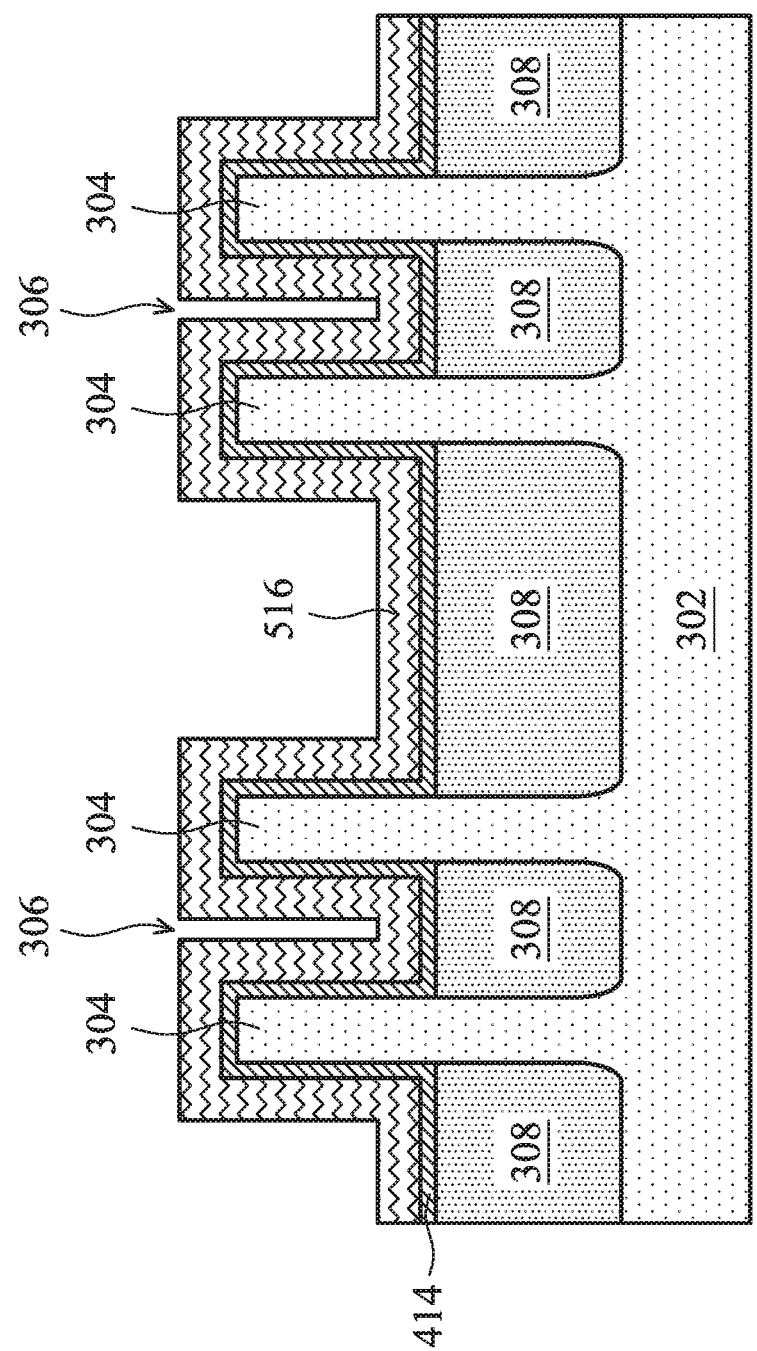

The film deposition process 202 includes depositing at least a portion of a film 516 over the substrate surface, as shown in FIG. 5. In some embodiments, the substrate surface may include exposed surfaces of the interfacial dielectric layer 414 that is conformally formed on fins 304 and the upper surfaces of the isolation regions 308. In some embodiments, the substrate surface may include an exposed surface of the seed layer (if present) that is conformally formed on the interfacial dielectric layer 414. In various embodiments, the film 516 formed by the film deposition process 202 may include or be any material suitable for a dummy gate layer. Suitable material for the film 516 may include amorphous silicon (a-Si), for example. In an example, the film 516 formed by the film deposition process 202 is amorphous silicon. The film deposition process 202 can be any suitable deposition process including, but is not limited to, low-pressure CVD (LPCVD), CVD, PECVD, ALD, plasma-enhanced ALD (PEALD), or any suitable deposition technique. In some embodiments, the film deposition process 202 is performed using LPCVD. LPCVD may be advantageous in some applications since it can deposit a wide range of film compositions with good conformal step coverage.

The film 516 may be formed by exposing the substrate surface to a silicon-containing precursor. Suitable silicon-containing precursors may include silanes, halogenated silanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include, but are not limited to, a chlorinated silane, such as monochlorosilane ($SiH_3Cl$, MCS), dichlorosilane ($Si_2H_2Cl_2$, DCS), trichlorosilane ($SiHCl_3$, TCS), hexachlorodisilane ($Si_2Cl_6$, HCDS), octachlorotrisilane ($Si_3Cl_8$, OCTS), or silicon tetrachloride (STC). In some embodiments, the silicon-containing precursor may use organosilanes which may include compounds with the empirical formula $R_ySi_xH_{(2x+2-y)}$, where R is independently methyl, ethyl, propyl, or butyl, such as methylsilane ($(CH_3)SiH_3$), dimethylsilane ($(CH_3)_2SiH_2$), ethylsilane ($(CH_3CH_2)SiH_3$), methyldisilane ($(CH_3)Si_2H_5$), dimethyldisilane ($(CH_3)_2Si_2H_4$), hexamethyldisilane ($(CH_3)_6Si_2$), tris(dimethylamino)silane (TDMAS), and any combination thereof. In some cases, the silicon-containing precursor may be carbon-free.

In examples implementing LPCVD, the reactor of the LPCVD can be heated and maintained by heating elements of the LPCVD reactor at a temperature in a range from about 120° C. to about 700° C. A silicon-containing precursor, such as $SiH_4$, $Si_2H_6$, $Si_2H_2Cl_2$, $SiHCl_3$, $Si_2Cl_6$, or any combination thereof, may be introduced into the LPCVD reactor from a gas injector. In some examples, the silicon-containing precursor includes $SiH_4$ and $Si_2H_6$. In some examples, the silicon-containing precursor is flowed at a rate less than or equal to about 2 standard liters per minute (sLm), such as in a range from about 0.35 sLm to about 2 sLm. The pressure inside the reactor can be maintained at a pressure less than or equal to about 1 Torr, such as in a range from about 0.1 Torr to about 1 Torr. The film deposition process 202 forms the film, e.g., amorphous silicon (a-Si), over the substrate surface with a thickness in a range from about 10 Angstroms to about 100 Angstroms.

While the dummy gate layer material using silicon is discussed, the concept described herein is equally applicable to other materials such as silicon germanium ($Si_xGe_{1-x}$, where x can be between approximately 0 and 1), silicon carbide, silicon phosphorus, silicon carbon phosphorus, germanium, a III-V compound semiconductor, a II-VI compound semiconductor, or the like. In cases where silicon germanium is implemented, a germanium-containing precursor (e.g., $GeH_4$, $Ge_2H_6$, etc.) or a halogenated germanium precursor (e.g., $GeCl_4$, $GeHCl_3$, $Ge_2Cl_6$, $Ge_3Cl_6$, etc.) may be used in conjunction with any of the silicon-containing precursors discussed above to fill the trenches, such as the trenches 306.

After the film deposition process 202, the dummy gate layer formation process 106 continues to the etching process 204. The etching process 204 can be performed in situ in the reactor of the LPCVD. A purge can be performed following the film deposition process 202 and before the etching process 204. During the etching process 204, the reactor of the LPCVD can be maintained at a temperature in a range from about 120° C. to about 700° C. An etchant gas (e.g. a halogen-containing precursor), such as $Cl_2$, HCl, $F_2$, or any combination thereof, may be introduced into the LPCVD reactor from a gas injector. In some examples, the etchant gas includes $Cl_2$. In some examples, the etchant gas is flowed at a rate in a range from about 100 sccm to about 1000 sccm. The pressure inside the reactor can be maintained at pressure less than or equal to about 4.5 Torr, such as in a range from about 0.25 Torr to about 4.5 Torr. The etching process 204 may remove portions of the deposited film 516 at upper portions of trenches, such as high aspect ratio trenches. By removing these portions of the deposited film 516, the film 516 may be prevented from being pinched-off or closed at the upper portions of the trenches before the respective trench is filled.

After the etching process 204, the dummy gate layer formation process 106 proceeds to the film deposition process 206. The film deposition process 206 can be performed in situ in the reactor of the LPCVD. A purge can be performed following the etching process 204 and before the film deposition process 206. The film deposition process 206 can be identical to the film deposition process 202 as discussed above.

In some embodiments, the etching process 204 and film deposition process 206 may be repeated any number of cycles. After the film deposition process 206, the dummy gate layer formation process 106 proceeds to operation 208 to determine whether another cycle should be repeated. If another cycle is to be repeated, the dummy gate layer formation process 106 proceeds to perform the etching process 204 and the film deposition process 206 as described above. If another cycle is not to be repeated, the dummy gate layer formation process 106 proceeds to the film reflow process 210.

The deposition-etch processes 204, 206 can be repeated sequentially and/or alternatingly to gradually fill the trenches 306 with film 516. Hence, the film 516 can have lateral growth fronts in a trench (e.g., proceeding laterally from sidewalls of respective fins 304). The deposition-etch processes 202-206 may be performed to cover the bottom surface and sidewalls of the trenches 306 and the top surface of the fins 304, but before the merging of the lateral growth fronts, as shown in FIG. 5. For example, this cyclic deposition-etch process can be repeated a number of cycles until the film 516 fills the trenches close to merging of the lateral fronts, but before merging, as determined at operation 208. Thereafter, the dummy gate layer formation process 106 may proceed to the film reflow process 210, film deposition process 212, crystalline film deposition process 214, another anneal process 216, and then to operation 108.

In some examples, the formation of the film 516 by processes 202, 204, 206 may result in deformation of one or more of the fins 304. The film 516 can be formed by processes 202, 204, 206 with a high stress, which can cause, e.g., bending of the fins 304.

In some embodiments, after another cycle is not to be repeated at operation 208, for example, before the lateral growth fronts of the film 516 merge, the film reflow process 210 is performed. The film reflow process 210 may be an anneal process. For example, the film reflow process 210 may be a thermal annealing process. In some examples, the film reflow process 210 is a $H_2/N_2$ environment anneal, low pressure anneal, or other type of anneal process. In some examples, the film reflow process 210 is a low-pressure, high-temperature anneal. In some examples, the film reflow process 210 is performed for a duration that is less than 2 hour, for example, in a range from about 10 min to about 90 min. In some examples, the anneal process is performed at an ambient temperature in a range from about 500° C. to about 560° C. In some examples, the duration and temperature of the anneal process may be selected or controlled in order to reduce or avoid crystallization of the film 516 (e.g., an a-Si film) during the anneal process. For example, for higher temperature anneals, the duration of the film reflow process 210 may be shorter, and for lower temperature anneals, the duration of the film reflow process 210 may be longer. In some examples, the anneal process is performed in an ambient that includes hydrogen ($H_2$) and/or nitrogen ($N_2$) gas. In some examples, the anneal process is performed in an ambient pressure that is less than 0.5 Torr, for example, in a range from 0.1 Torr to 0.5 Torr.

Figure 6:
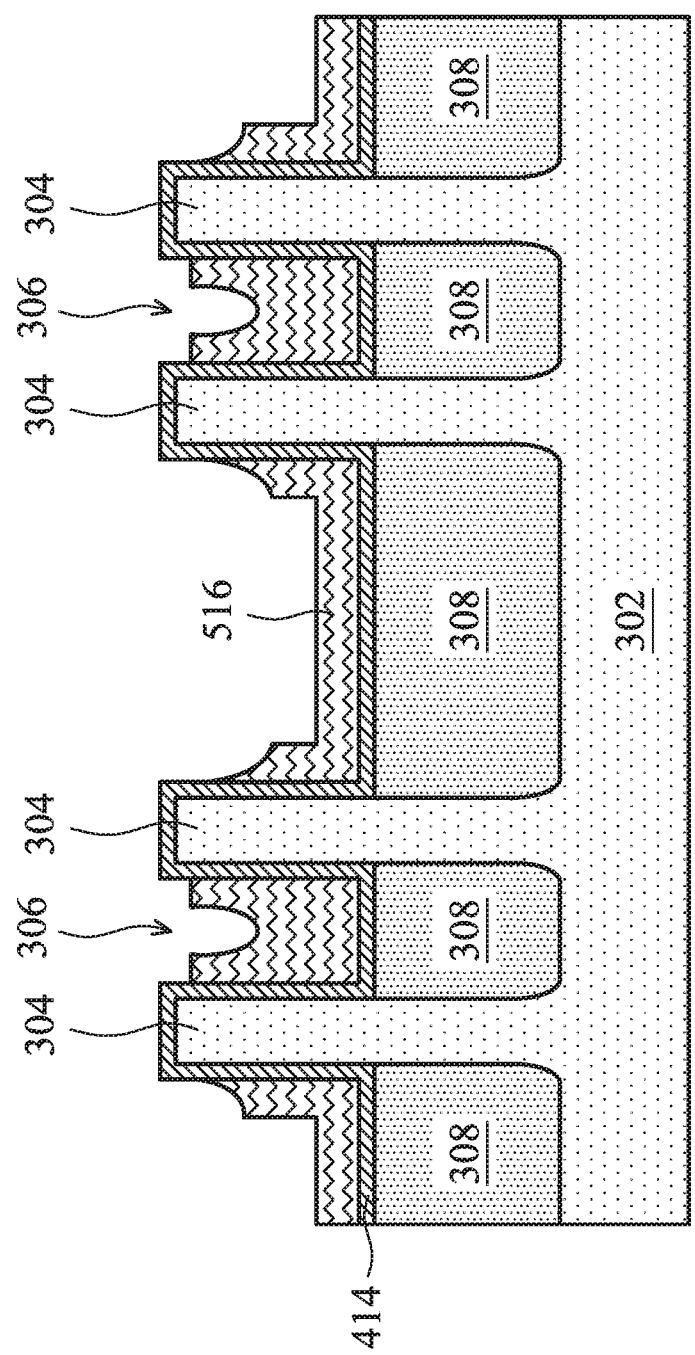

The film reflow process 210 may result in reflow of the film 516, as shown in FIG. 6. The film reflow process 210 may melt the film 516 to below the top surfaces of the fins 304 and may cause the lateral fronts of the film 516 to merge in the trenches 306. Generally, when the film 516 is a-Si, for example, the anneal process 212 may break Si—H bonds in the film 516 during anneal process 212. The breaking of the Si—H bonds may result in dehydrogenation of the film 516 and dangling Si bonds in the film 516. The reflow in the film 516 may result in the release of stress from the film 516. The release of stress from the film 516 can reduce or eliminate bending of the fins 304. The dangling Si bonds may then be restructured in the film 516 as Si—Si and/or Si—H bonds, which can cause the film 516 to become denser.

Figure 7:
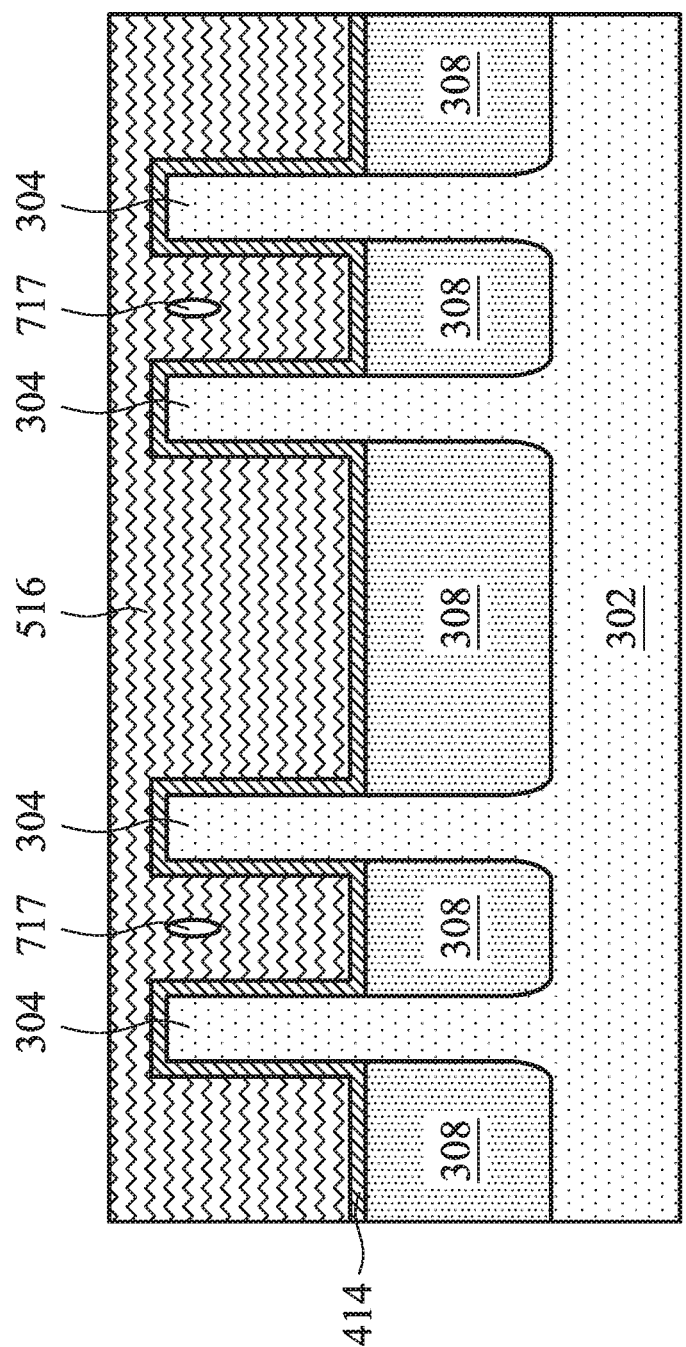

After the film reflow process 210, the dummy gate layer formation process 106 proceeds to a film deposition process 212. The film deposition process 212 can be performed in situ in the reactor of the LPCVD. A purge can be performed following the anneal process 210 and before the film deposition process 212. In some examples, the film deposition process 212 can be a single deposition process similar to the film deposition process 202 as described above. In some examples, the film deposition process 212 may be a cyclic deposition-etch process similar to the deposition-etch processes 202-208 described above. The film deposition process 212 continues to deposit the film 516 as shown in FIG. 7. In some examples, the portion of the film 516 deposited by the film deposition process 212 may be referred to as a cap layer over the portion of the film 516 that was previously deposited and was reflowed in the film reflow process 210.

The portion of the film 516 deposited by the film deposition process 212 (e.g., the cap layer) may be deposited until at least some of the trenches 306 (e.g., high aspect ratio trenches) between fins 304 are filled with the film 516. As shown in FIG. 7, the deposition process 212 may result in formation of seams and/or voids 717 in the film 516 between neighboring fins 304. In some examples, the film deposition process 212 continues the deposition of the film 516 (e.g., the cap layer) until the film 516 obtains a desired thickness. For example, the deposition process 212 can continue until a lowest point of the upper surface of the cap layer is some thickness above a level of top surfaces of the fins 304, which thickness may be, for example, in a range from about 3 nm to about 10 nm.

Figure 8:
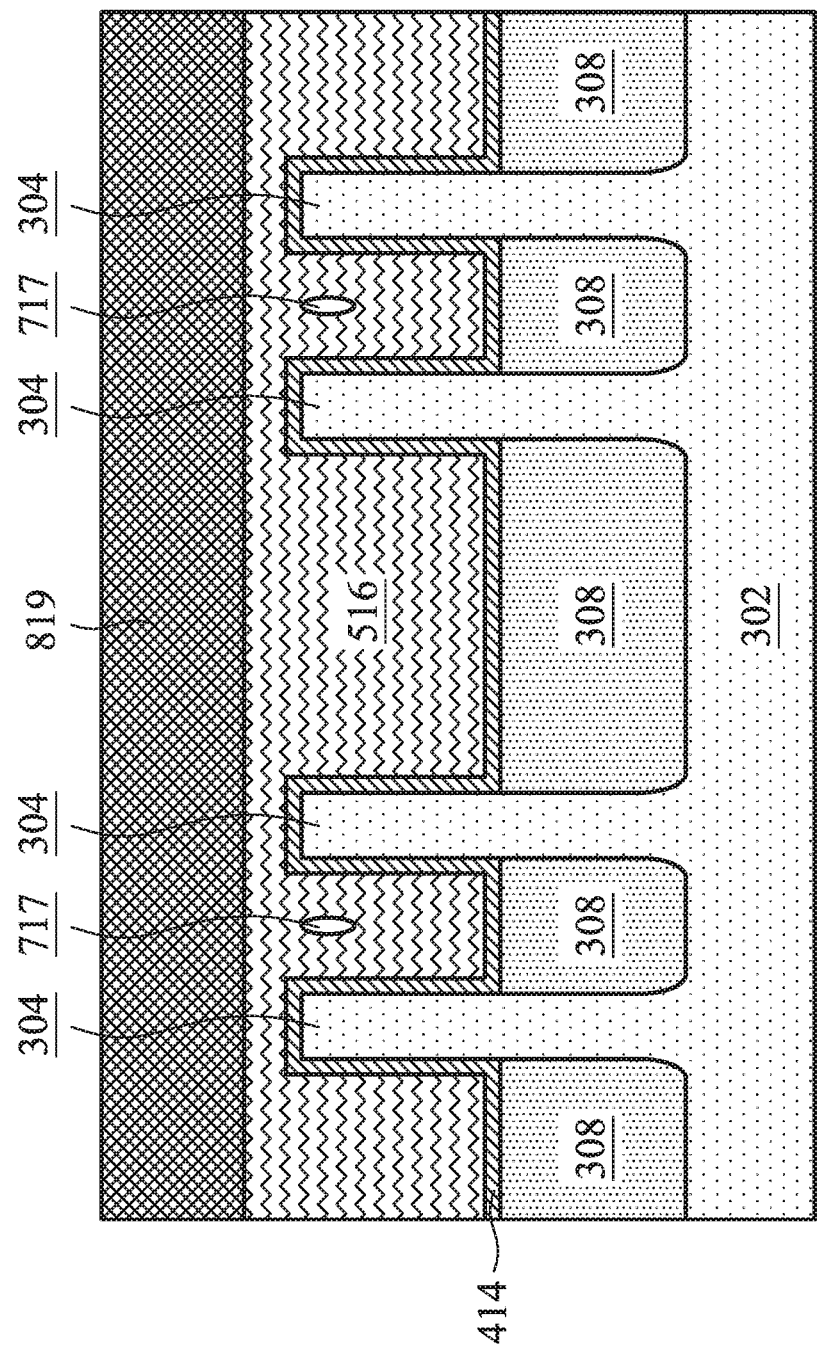

After the film deposition process 212, the dummy gate layer formation process 106 proceeds to a crystalline film deposition process 214. The crystalline film deposition process 214 can be performed in the reactor of the LPCVD. In some examples, the crystalline film deposition process 214 may use a monosilane precursor, disilane, or other suitable precursor. The crystalline film deposition process 214 may deposit a crystalline film 819, such as a high temperature silicon film (e.g., polysilicon), as shown in FIG. 8. The crystalline film may be deposited at a temperature in a range from about 600° C. to about 700° C., such as about 620° C. The crystalline film deposition process 214 continues the deposition of a crystalline film 819 until the crystalline film 819 obtains a desired thickness. For example, the crystalline film deposition process 214 can continue until a lowest point of the upper surface of the crystalline film 819 is some thickness above the film 516 (e.g., above the cap layer), which thickness may be in a range from about 1500 angstroms to about 2000 angstroms, for example, about 1800 angstroms. The crystalline film 819 may be crystalline silicon.

In some examples, after the crystalline film deposition process 214, the dummy gate layer formation process 106 proceeds to an anneal process 216. In some examples, the anneal process 216 is not performed. For example, the crystalline film deposition process 214 can be at a temperature that can crystallize the film 516. The crystalline film deposition process 214 and/or anneal process 216 are performed to crystallize the film 516. The anneal process 216 may be a thermal annealing process. In some examples, the anneal process 216 is a $H_2/N_2$ environment anneal, low pressure anneal, or other type of anneal process. In some examples, the anneal process 216 is performed for a duration that is less than one hour, for example, in a range from about 10 min to about 60 min. In some examples, the anneal process 216 is a higher temperature anneal than the film reflow process 210. In some examples, the anneal process is performed at an ambient temperature in a range from about 500° C. to about 700° C., such as about 620° C. In some examples, the anneal process 216 is performed in a hydrogen ($H_2$) or nitrogen ($N_2$) ambient gas. In some examples, the anneal process is performed in an ambient pressure that is equal to or less than about 0.5 Torr, for example, in a range from about 0.1 Torr to about 0.5 Torr.

Figure 9A:
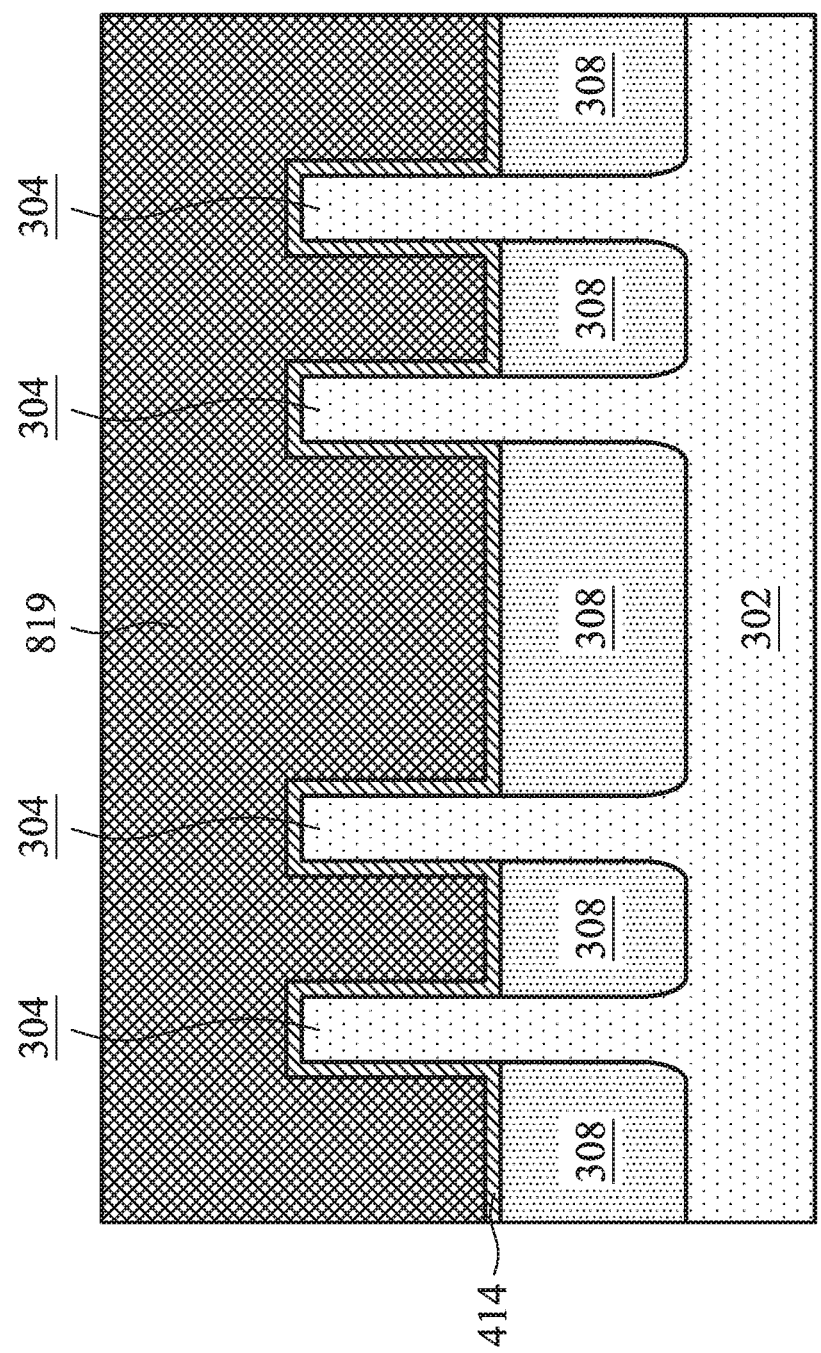
Figure 9B:
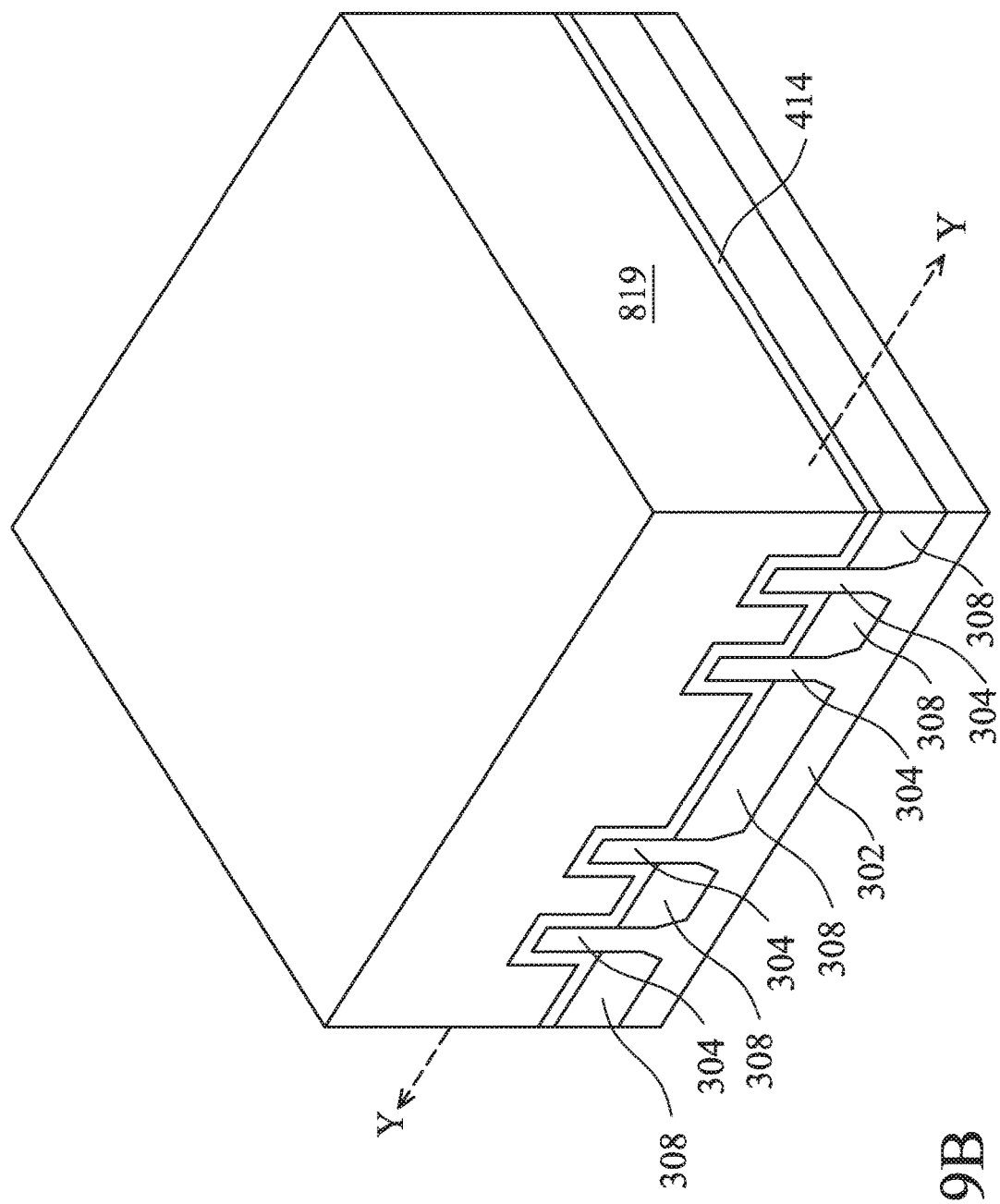

In some examples, the crystalline film deposition process 214 and/or the anneal process 216 result in crystallization of the film 516, as shown in FIG. 9A. For example, the crystalline film deposition process 214 and/or the anneal process 216, each of which can be a high temperature process, result in crystallization of amorphous silicon in the film 516 to polysilicon. As shown in FIGS. 9A and 9B, the crystalline film 819 and the film 516 may become a single layer. As shown in FIG. 9A, the crystallization of the film may reduce or eliminate the seams and/or voids 717 in the crystalline film 819.

FIG. 9A illustrates the crystalline film 819 after the crystalline film deposition process 214, anneal process 216, and subsequent planarization of the crystalline film 819. As shown, trenches 306 between neighboring fins 304 have been filled with substantially no seam or void (e.g., no seam and/or void has a dimension greater than 1 nm in the trenches 306) after a suitable number of cycles of the deposition-etch processes 204, 206, the film reflow process 210, film deposition process 212, crystalline film deposition process 214, and anneal process 216. In some examples, such as illustrated, the crystalline film 819 is planarized, such as by a chemical mechanical planarization (CMP), to form a top surface of the crystalline film 819 to be planar.

FIG. 9B illustrates a three-dimensional view of an intermediate structure where the dummy gate layer (e.g., the crystalline film 819) has been formed over the substrate surface according to some embodiments. After the crystalline film 819 is formed and the trenches are filled, the flow chart 100 may proceed to operation 108, as will be discussed below in more detail.

Figure 10B:
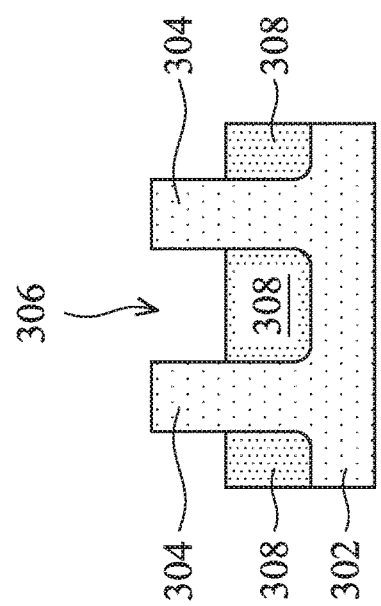
Figure 10A:
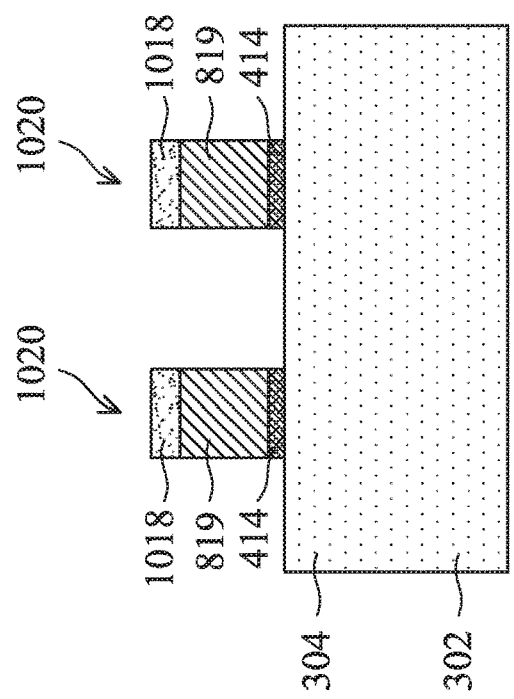
Figure 10C:
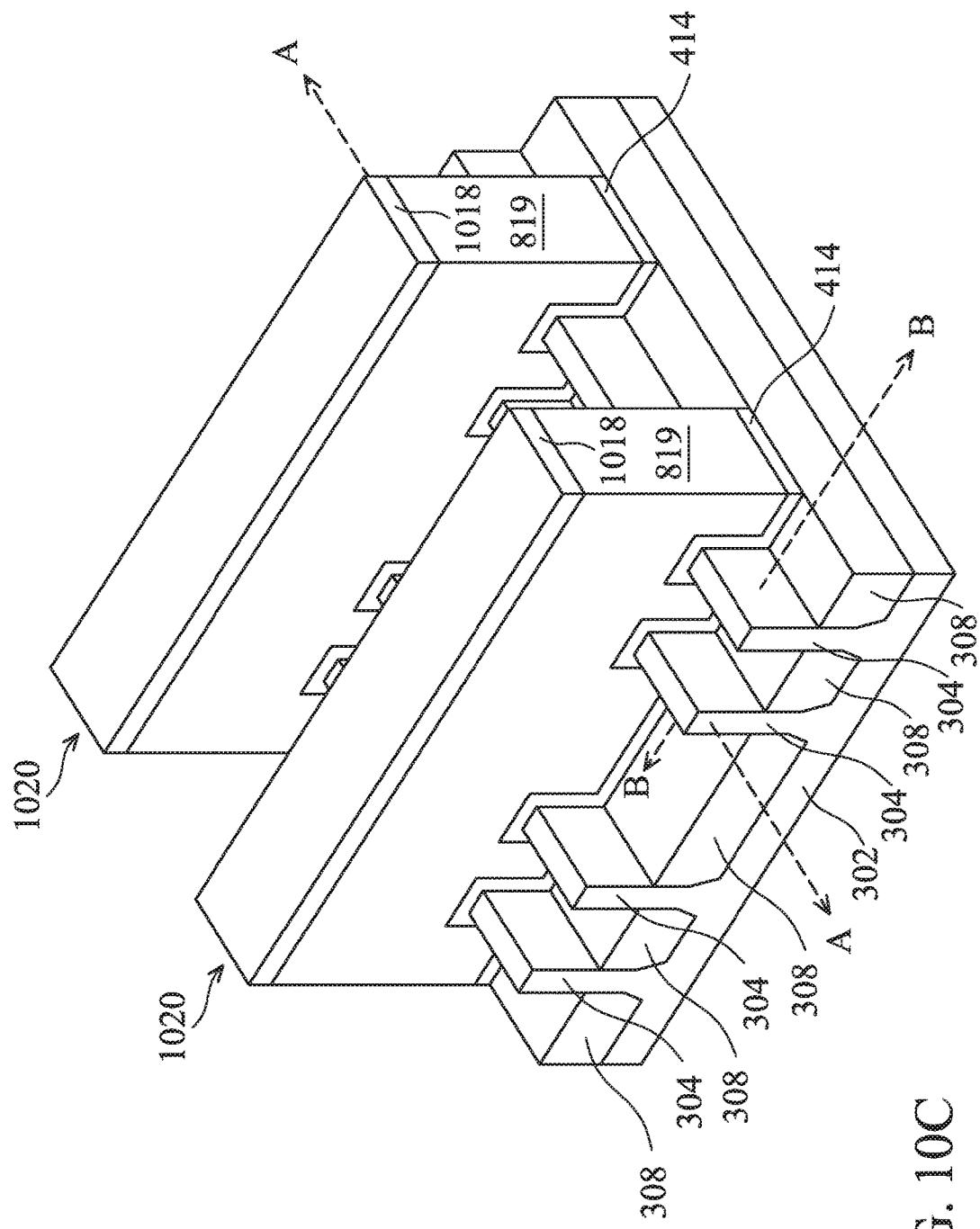

At operation 108, and with reference to FIGS. 10A, 10B, and 10C, a mask 1018 is formed over the dummy gate layer 819. The mask 1018, dummy gate 819, and interfacial dielectric layer 414 (and seed layer if used) may then be patterned, for example, using photolithography and one or more etch processes to form the mask 1018, dummy gate layer 819, and interfacial dielectric layer 414 for each dummy gate structure 1020, as shown in FIGS. 10A and 10C. The mask 1018 may include or be silicon nitride, silicon oxynitride, silicon carbon nitride, the like, or a combination thereof, deposited by CVD, physical vapor deposition (PVD), ALD, or any suitable deposition technique. Particularly, the dummy gate structures 1020 are over and extend perpendicularly to the fins 304.

FIG. 10C further illustrates reference cross-sections. Cross-section A-A of FIG. 10C is in a plane along channels in one fin 304 between opposing source/drain regions. Cross-section B-B of FIG. 10C is in a plane perpendicular to cross-section A-A, and is across source/drain regions in neighboring fins 304. FIG. 10A and following figures ending with an "A" designation illustrate cross-sectional views at various instances of processing corresponding to cross-section A-A of FIG. 10C, and FIG. 10B and following figures ending with a "B" designation illustrate cross-section views at various instances of processing corresponding to cross-section B-B of FIG. 10C.

Figures 11A, 11B:
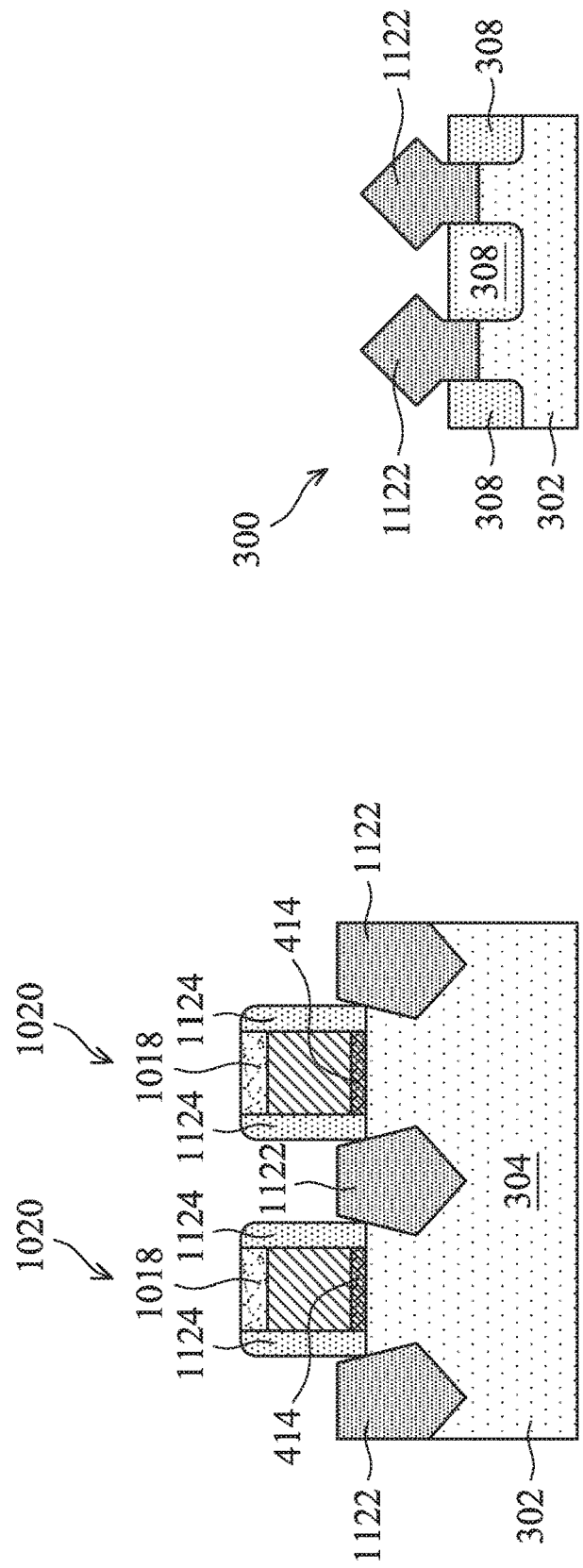

At operation 110, and with reference to FIGS. 11A and 11B, gate spacers 1124 are formed along sidewalls of the dummy gate structures 1020 (e.g., sidewalls of the interfacial dielectric layer 414, dummy gate layer 819, and mask 1018) and over the fins 304. The gate spacers 1124 may be formed by conformally depositing one or more layers for the gate spacers 1124 and anisotropically etching the one or more layers, for example. The one or more layers for the gate spacers 1124 may include a material different from the material(s) for the dummy gate structure 1020. In some embodiments, the gate spacer 1124 may include or be a dielectric material, such as silicon nitride, silicon oxynitride, silicon carbon nitride, the like, multi-layers thereof, or a combination thereof, and may be deposited by any suitable deposition technique. An anisotropic etching process is then performed to remove portions of the layers to form the gate spacers 1124, as depicted in FIG. 11A.

If seams and/or voids 717 are not reduced or eliminated from the crystalline film 819 as described above, the patterning of the dummy gate layer 819 in operation 108, and illustrated in FIGS. 11A and 11B, could expose the seam and/or void 717 at a sidewall of the dummy gate structure 1020. With the seam and/or void 717 exposed at the sidewall of the dummy gate structure 1020, the one or more layers for the gate spacers 1124 could be deposited in the seam and/or void 717, and therefore, the gate spacers 1124 could be formed with a portion injected into the seam and/or void 717. This injected portion could cause defects in the removal of the dummy gate structure 1020 and/or in the formation of the replacement gate structure 1230, as described subsequently. However, in some examples, the risk of a seam and/or void 717 being in the dummy gate layer 819 at the patterning of the dummy gate layer 819 can be reduced (e.g., by performing the film reflow process 210, film deposition process 212, crystalline film deposition process 214, and anneal process 216), which can reduce the risk of an injected portion of a gate spacer 1124 being formed in the dummy gate layer 819.

After the gate spacers 1124 are formed, source/drain regions 1122 may be formed in the fins 304, as depicted in FIGS. 11A and 11B. In some examples, recesses can be etched in the fins 304 using the dummy gate structures 1020 and gate spacers 1124 as masks (such that recesses are formed on opposing sides of the dummy gate structures 1020), and a material may be epitaxially grown in the recesses to form the source/drain regions 1122. Additionally or alternatively, the source/drain regions 1122 may be formed by implanting dopants into the fins 304 and/or the epitaxial source/drain regions 1122 using the dummy gate structures 1020 as masks (such that the source/drain regions 1122 are formed on opposing sides of the dummy gate structures 1020).

Depending on the conductivity type of the transistor, the material for the source/drain regions 1122 may be chosen to include or be silicon germanium, silicon carbide, silicon phosphorus, silicon carbon phosphorus, germanium, a III-V compound semiconductor, a II-VI compound semiconductor, or the like. The source/drain regions 1122 may be raised with respect to the fins 304 and may have facets, which may correspond to crystalline planes of the semiconductor substrate 302.

With reference to FIGS. 12A and 12B, an contact etch stop layer (CESL) 1226 and a first interlayer dielectric (ILD) 1228 are sequentially formed on surfaces of the source/drain regions 1122, sidewalls and top surfaces of the gate spacers 1124, top surfaces of the masks 1018, and top surfaces of the isolation regions 308 using any suitable deposition technique. The CESL 1226 is deposited conformally and may include or be silicon nitride, silicon carbon nitride, carbon nitride, the like, or a combination thereof. The first ILD 1228 may include or be tetraethylorthosilicate (TEOS) oxide, silicon dioxide, a low-k dielectric material (e.g., a material having a dielectric constant lower than silicon dioxide), or another material. A CMP process may then be performed to planarize the first ILD 1228 and the CESL 1226 and to remove the masks 1018 of the dummy gate structures 1020, thereby leveling the top surface of the first ILD 1228 and CESL 1226 with the top surfaces of the dummy gate layers 819.

At operation 112, and with reference to FIGS. 12A and 12B, the dummy gate structures 1020 are removed and replacement gate structures 1230a, 1230b are formed where the dummy gate structures 1020 were removed. The dummy gate structures 1020 can be removed using one or more etch processes. Upon removal of the dummy gate structures 1020, recesses are formed between the gate spacers 1124 where the dummy gate structures 1020 are removed, and channel regions of the fins 304 are exposed through the recesses.

As described previously, an injected portion of a gate spacer 1124 could be formed if a seam and/or void 717 is exposed in the dummy gate structure 1020 during the formation of the gate spacer 1124. The injected portion could act as an etch stop and prevent removal of some of the dummy gate structure (e.g., such as underlying the injected portion). This could cause a defect in the subsequently formed replacement gate structure. In some examples, as described above, the risk of an injected portion of a gate spacer 1124 in a dummy gate structure 1020 can be reduced, which can reduce the risk of such an injected portion acting as an etch stop and causing a defect. Hence, yield in the manufactured device can be increased.

The replacement gate structures 1230a, 1230b are then formed in the recesses where the dummy gate structures 1020 were removed. The replacement gate structures 1230a, 1230b each may include, as illustrated in FIG. 12A, an interfacial dielectric 1232, a gate dielectric layer 1234, one or more optional conformal layers 1236, and a gate conductive fill material 1238. The interfacial dielectric 1232 is formed on top surfaces of the fins 304 along the channel regions. The interfacial dielectric 1232 can be an oxide (e.g., silicon oxide) formed by thermal or chemical oxidation of the fin 304, and/or a nitride (e.g., silicon nitride), and/or another dielectric layer using any suitable deposition technique.

The gate dielectric layer 1234 can be conformally deposited in the recesses where dummy gate structures 1020 were removed (e.g., on the interfacial dielectric 1232, and sidewalls of the gate spacers 1124) and on the top surfaces of the first ILD 1228, the CESL 1226, and gate spacers 1124. The gate dielectric layer 1234 can be or include silicon oxide, silicon nitride, a high-k dielectric material, multilayers thereof, or other dielectric material. A high-k dielectric material include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 1236 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A layer for the gate conductive fill material 1238 is formed over the one or more optional conformal layers 1236, if implemented, and/or the gate dielectric layer 1234. The layer for the gate conductive fill material 1238 can fill remaining recesses where the dummy gate structures 1020 were removed. The layer for the gate conductive fill material 1238 may be or include a metal-containing material such as tungsten, cobalt, aluminum, ruthenium, copper, multi-layers thereof, a combination thereof, or the like.

A planarization process, like a CMP, may remove portions of the layer for the gate conductive fill material 1238, one or more optional conformal layers 1236, and gate dielectric layer 1234 above the top surfaces of the first ILD 1228, the CESL 1226, and gate spacers 1124. The replacement gate structures 1230 including the gate conductive fill material 1238, one or more optional conformal layers 1236, gate dielectric layer 1234, and interfacial dielectric 1232 may therefore be formed as illustrated in FIG. 12A.

Figure 13B:
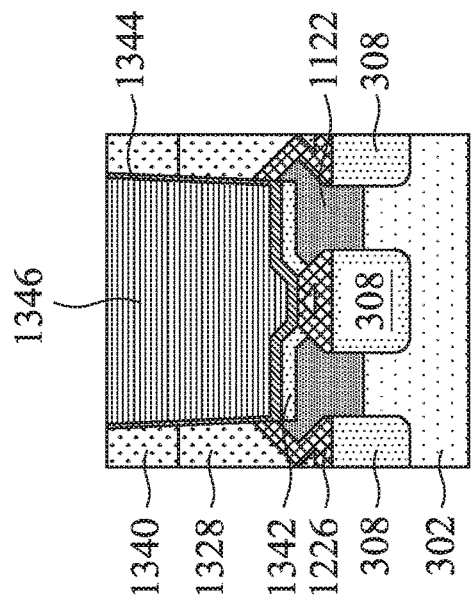
Figure 13A:
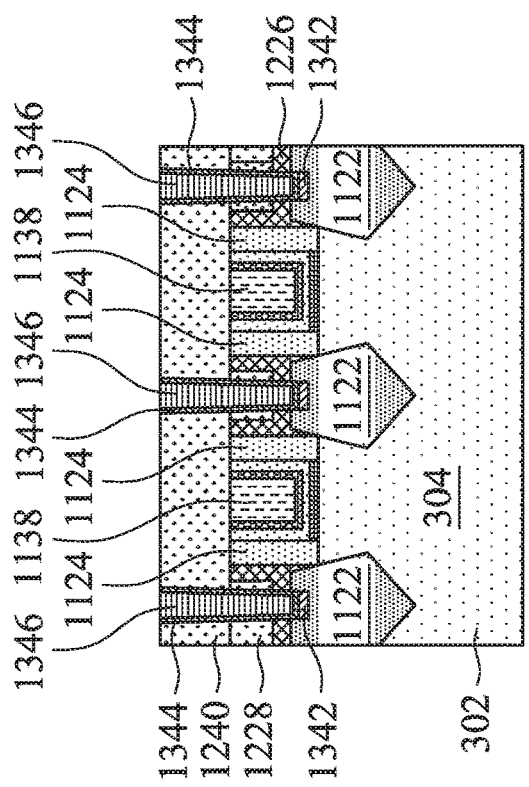

A second ILD 1340 is formed over the gate conductive fill material 1238, one or more optional conformal layers 1236, and gate dielectric layer 1234, first ILD 1228, gate spacers 1124, and CESL 1226, as shown in FIGS. 13A and 13B. The second ILD 1340 may include or be silicon dioxide, a low-k dielectric material, silicon oxynitride, PSG, BSG, BPSG, USG, FSG, OSG, SiO$_x$C$_y$, Spin-On-Glass, Spin-On-Polymers, silicon carbon material, a compound thereof, a composite thereof, the like, or a combination thereof.

After the second ILD 1340 is formed, source/drain contact openings are formed through the second ILD 1340, the first ILD 1228, and the CESL 1226 to the source/drain regions 1122 to expose at least portions of the source/drain regions 1122. The second ILD 1340, the first ILD 1228, and the CESL 1226 may be patterned with the openings, for example, using photolithography and one or more etch processes, such as a dry etch or any suitable anisotropic etch process. The source/drain contact openings allow making electrical contact to the source/drain regions 1122 for the transistors.

After the formation of the source/drain contact openings, conductive features are formed in the openings to the source/drain regions 1122. The conductive features may include a silicide region 1342 formed on the source/drain regions 1122, a barrier layer 1344, and a conductive material 1346 on the barrier layer 1344. The silicide region 1342 may be formed by thermally reacting an upper portion of the source/drain regions 1122 with a metal layer (not shown), such as titanium, tantalum, or the like, formed on the source/drain regions 1122. The barrier layer 1344 is conformally deposited in the source/drain contact openings on the silicide region 1342 and over the second ILD 1340, the first ILD 1228, and the CESL 1226, as shown in FIGS. 13A and 13B. The barrier layer 1344 may be or include titanium nitride, titanium oxide, tantalum nitride, tantalum oxide, any suitable transition metal nitrides or oxides, the like, or any combination thereof, and may be deposited by any suitable deposition technique. The conductive material 1346 may be or include cobalt, tungsten, copper, ruthenium, aluminum, gold, silver, alloys thereof, the like, or a combination thereof, and may be deposited by any suitable deposition technique. After the conductive material 1346 is deposited, excess conductive material 1346 and barrier layer 1344 may be removed by using a planarization process, such as a CMP. The planarization process may remove excess conductive material 1346 and barrier layer 1344 from above a top surface of the first ILD 1228. Hence, top surfaces of the conductive material 1346, the barrier layer 1344, and the first ILD 1228 may be coplanar. The conductive features may be referred to as contacts, plugs, etc.

Various embodiments described herein may offer several advantages. It will be understood that not all advantages have been necessarily described herein, no particular advantage is required for any embodiment, and other embodiments may offer different advantages. As an example, embodiments described herein include improved gate formation methods for forming a dummy gate layer in high aspect ratio trenches using a cyclic deposition-etch process with film reflow, another film deposition, crystalline film deposition, and anneal processes. The film reflow process can reduce or eliminate fin bending, and the crystalline film deposition and anneal process can reduce voids and/or seams in the dummy gate layer. Additionally, by reducing or eliminating voids and/or seams, risk of defects in replacement gate structures can be reduced.

In an embodiment, a method for semiconductor processing is provided. The method includes performing a cyclic deposition-etch process to form a conformal film over a bottom surface and along sidewall surfaces of a feature on a substrate. The method includes reflowing the conformal film. The method includes forming a cap layer on the reflowed film. The method includes depositing a crystalline film on the cap layer. The method includes crystallizing the reflowed film and the cap layer after depositing the crystalline film.

In another embodiment, the method includes forming fins on a substrate. Sidewalls of the fins and a bottom surface between the sidewalls of the fins define a trench therebetween. The method includes forming a gate layer in the trench and over the fins. Forming the gate layer includes depositing a first portion of the gate layer in the trench by performing a cyclic deposition-etch process until before the first portion of the gate layer merges by lateral growth from the sidewalls of the fins. Forming the gate layer includes performing a first anneal on the first portion of the gate layer to reflow the first portion of the gate layer. Forming the gate layer includes depositing a second portion of the gate layer over the first portion of the gate layer and filling the trench. Forming the gate layer also includes crystallizing the first and second portions of the gate layer. The method also includes, after forming the gate layer, patterning the gate layer to form a gate structure over the fins.

In yet another embodiment, the method includes forming fins on a substrate. Sidewalls of the fins and a bottom surface define a trench therebetween. The method includes forming a dummy gate structure over the fins. Forming the dummy gate structure includes depositing a first portion of a dummy gate layer. Forming the dummy gate structure includes reflowing the first portion of the dummy gate layer using a first anneal process. Forming the dummy gate structure includes depositing a second portion of the dummy gate layer over the reflowed first portion of the dummy gate layer. After depositing the second portion of the dummy gate layer, the first portion and the second portion of the dummy gate layer are each amorphous. Forming the dummy gate structure includes depositing a third portion of the dummy gate layer over the second portion of the dummy gate layer. The third portion of the dummy gate layer are crystalline as deposited. Forming the dummy gate structure also includes crystallizing the first portion and the second portion of the dummy gate layer using a second anneal process. The method includes patterning the dummy gate layer. The method includes removing the dummy gate structure to form an opening. The method also includes forming a replacement gate structure over the fins in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   performing a cyclic deposition-etch process to form a conformal film over a bottom surface and along sidewall surfaces of a feature on a substrate;
   reflowing the conformal film;
   forming a cap layer on the reflowed film;
   depositing a crystalline film on the cap layer; and
   after depositing the crystalline film, crystallizing the reflowed film and the cap layer.

2. The method of claim 1, wherein the cyclic deposition-etch process is repeated until before lateral growth fronts of the conformal film grown from the respective sidewall surfaces of the feature merge together.

3. The method of claim 2, wherein reflowing the conformal film causes the conformal film to merge between neighboring sidewall surfaces.

4. The method of claim 1, wherein the reflowed film comprises amorphous silicon.

5. The method of claim 1, wherein the cap layer is a same material as the conformal film.

6. The method of claim 1, wherein the cap layer fills the feature.

7. The method of claim 1, wherein the crystalline film comprises crystalline silicon.

8. The method of claim 1, wherein before crystallizing the reflowed film and the cap layer, the reflowed film and the cap layer are amorphous silicon, and after crystallizing the reflowed film and the cap layer, the reflowed film and the cap layer comprise polysilicon.

9. The method of claim 1, wherein crystallizing the reflowed film and the cap layer includes annealing the reflowed film and the cap layer.

10. The method of claim 1, wherein before depositing the crystalline film, the reflowed film and the cap layer include a first number of voids or seams, and wherein after crystallizing the reflowed film and the cap layer, the reflowed film and the cap layer include a second number of voids or seams, the second number being less than the first number.

11. A method for semiconductor processing, the method comprising:
   forming fins on a substrate, sidewalls of the fins and a bottom surface between the sidewalls of the fins defining a trench therebetween;
   forming a gate layer in the trench and over the fins, forming the gate layer comprising:
      depositing a first portion of the gate layer in the trench by performing a cyclic deposition-etch process, until before the first portion of the gate layer merges by lateral growth from the sidewalls of the fins;
      performing a first anneal on the first portion of the gate layer to reflow the first portion of the gate layer;
      depositing a second portion of the gate layer over the first portion of the gate layer and filling the trench; and
      crystallizing the first and second portions of the gate layer; and
   after forming the gate layer, patterning the gate layer to form a gate structure over the fins.

12. The method of claim 11, wherein before and after the first anneal, the first portion of the gate layer comprises amorphous silicon.

13. The method of claim 11, wherein crystallizing the first and second portions of the gate layer comprises depositing a crystalline layer over the second portion of the gate layer.

14. The method of claim 13, wherein crystallizing the first and second portions of the gate layer further comprises performing a second anneal process on the first and second portions of the gate layer after depositing the crystalline layer.

15. The method of claim 13, wherein the crystalline layer is deposited at a temperature in a range from 600° C. to 700° C.

16. The method of claim 11, wherein before crystallizing the first and second portions of the gate layer, the gate layer includes a first number of voids or seams, and wherein after the crystallizing, the gate layer includes a second number of voids or seams, the second number being less than the first number.

17. A method for semiconductor processing, the method comprising:
    forming fins on a substrate, sidewalls of the fins and a bottom surface defining a trench therebetween;
    forming a dummy gate structure over the fins, wherein forming the dummy gate structure comprises:
        depositing a first portion of a dummy gate layer;
        reflowing the first portion of the dummy gate layer using a first anneal process;
        depositing a second portion of the dummy gate layer over the reflowed first portion of the dummy gate layer, wherein after depositing the second portion of the dummy gate layer, the first portion and the second portion of the dummy gate layer are each amorphous;
        depositing a third portion of the dummy gate layer over the second portion of the dummy gate layer, the third portion of the dummy gate layer being crystalline as deposited; and
        crystallizing the first portion and the second portion of the dummy gate layer using a second anneal process; and
    patterning the dummy gate layer;
    removing the dummy gate structure to form an opening; and
    forming a replacement gate structure over the fins in the opening.

18. The method of claim 17, wherein:
    as deposited, the first portion of the dummy gate layer covers respective top surfaces of the fins, sidewalls of the fins, and the bottom surface of the trench, and does not merge in the trench; and
    after reflowing the first portion of the dummy gate layer, the reflowed first portion of the dummy gate layer covers a portion of the sidewalls of the fins and the bottom surface of the trench, merges in a portion of the trench, and does not cover the top surfaces of the fins.

19. The method of claim 17, wherein:
    the second portion of the dummy gate layer fills the trench and covers respective top surfaces of the fins;
    after depositing the second portion of the dummy gate layer, the first portion and the second portion of the dummy gate layer are each amorphous silicon; and
    after crystallizing the first portion and the second portion of the dummy gate layer, the first portion and the second portion of the dummy gate layer each comprise polysilicon.

20. The method of claim 17, wherein the third portion of the dummy gate layer comprises crystalline silicon.

* * * * *